United States Patent [19]

Mizobuchi et al.

[11] 4,259,433
[45] Mar. 31, 1981

[54] METHOD FOR PRODUCING DISK-RECORDING PLATES

[75] Inventors: Yuzo Mizobuchi; Masamichi Sato; Tsunehiko Takahashi, all of Asaka, Japan

[73] Assignee: Fuji Photo Film Co., Ltd., Minami-ashigara, Japan

[21] Appl. No.: 32,829

[22] Filed: Apr. 24, 1979

Related U.S. Application Data

[63] Continuation of Ser. No. 843,915, Oct. 20, 1977, abandoned.

[30] Foreign Application Priority Data

Oct. 22, 1976 [JP] Japan ................................. 51-126389

[51] Int. Cl.$^3$ ................................................. G03C 5/00
[52] U.S. Cl. ................................. 430/296; 156/643; 156/646; 156/659.1; 204/192 EC; 204/192 E; 427/53.1; 430/320; 430/323; 430/326; 430/394; 430/945
[58] Field of Search ................ 96/36, 38.3, 27 H; 156/633, 634, 643, 646, 659; 346/76 L; 427/53; 204/192 E, 192 EC; 219/121 LM; 430/296, 320, 323, 326, 394, 945

[56] References Cited

U.S. PATENT DOCUMENTS

| | | | |
|---|---|---|---|
| 3,256,524 | 6/1966 | Stauffer | 346/76 L |
| 3,560,994 | 2/1971 | Wolff et al. | 346/76 L X |
| 3,668,028 | 6/1972 | Short | 156/643 |
| 3,867,217 | 2/1975 | Maggs et al. | 156/643 |
| 3,924,093 | 12/1975 | Feldman et al. | 219/121 LM |
| 3,957,609 | 5/1976 | Sasano et al. | 204/192 E X |
| 3,990,084 | 11/1976 | Hamisch et al. | 346/76 L X |
| 4,000,492 | 12/1976 | Willens | 346/76 L X |
| 4,026,742 | 5/1977 | Fujino | 204/192 E X |
| 4,030,967 | 6/1977 | Ingmey | 156/643 |
| 4,057,831 | 11/1977 | Jacobs et al. | 204/192 E X |

*Primary Examiner*—Edward C. Kimlin
*Attorney, Agent, or Firm*—Sughrue, Rothwell, Mion, Zinn and Macpeak

[57] ABSTRACT

A disk-recording plate is produced by successively forming an etching layer and a laser-sensitive layer on a substrate. The assembly is exposed to the irradiation of laser beams to selectively remove the laser-sensitive layer and is then subjected to a sputter-etching treatment in an atmosphere of a reactive gas to remove the etching layer at portions corresponding to the removed portions of the laser-sensitive layer. The method permits monitoring of recording, and thus ensures accurate recording with good resolution.

14 Claims, 13 Drawing Figures

METHOD FOR PRODUCING DISK-RECORDING PLATES

This is a Continuation of application Ser. No. 843,915, filed Oct. 20, 1977, now abandoned.

BACKGROUND OF THE INVENTION

This invention relates to a method for producing disk-recording plates. Disk-recording plates are used in a videodisk system wherein information such as sounds and/or images is recorded as changes in the shape and dimension of pits (grooves) or blocks (ridges) in an information track of a disk-recording plate, and the recorded information is sensed mechanically, electrically or optically to generate image and/or sound signals which are reproduced on a receiver.

According to the videodisk system, a press master (stamper) is made by, for example, plating on the disk-recording plate and then the plated layer is peeled from the disk-recording plate to form a press master, and many press plates are made from the press master by successive transfer as in the case of preparing audio-record disks or sonosheets. These transfered plates are used as the reproducing media (that is, videodisks). Accordingly, the videodisk system has the advantage that a number of reproducing media can be manufactured at a time at very low cost as compared with other image recording-reproducing systems such as a video tape recording (VTR) system.

Disk-recording plates and press masters are manufactured, for example, by a process shown in FIGS. 1 to 5 of the drawings. FIG. 1 shows a photosensitive material for disk-recording plates which consists, for example, of a base plate 10 of an optically polished glass plate, and a positive photoresist coated thereon in a thin layer 11 (for example, about 1200 to 1500 Å). The thickness of the photoresist layer is adjusted to one-fourth of the beam wavelength for reading so that when a videodisk is made by using the resulting master, the depth of pits formed in it is sufficient for the occurrence of the scattering or interference of light. Then, signals are inscribed in the photoresist layer by laser beams modulated with video signals. Subsequent development of the photoresist layer results in a disk-recording plate as shown in FIG. 2. In FIG. 2, the reference numeral 20 represents a portion which has been exposed to the irradiation of laser beams and then developed. Subsequently, as shown in FIG. 3, a thin layer of metal 30 is formed on the entire surface by known techniques such as vacuum deposition or chemical plating. Then, as shown in FIG. 4, a metal 40 such as nickel is formed on top of the metal layer 30 by electroplating as in the conventional production of audio record disks. Finally, the plated nickel layer is peeled to form a press master shown in FIG. 5. Raised portions 50 correspond to depressed portions 20 in FIG. 2. Videodisks having pits formed corresponding to the raised portions 50 in FIG. 5 are obtained by pressing the master against a thermoplastic material such as a vinyl compound and heating and cooling it in substantially the same manner as in the production of audio disk records.

This method of producing press masters for videodisks has the defect that whether an accurate recording is made on the master material (by monitoring of the recording) cannot be confirmed until after the photoresist layer has been exposed to the irradiation of laser beams and then developed, and that the depth of the pits cannot be adjusted to a constant value because the photoresist layer is difficult to coat in a uniform thickness.

Another conventional method is shown in FIGS. 6 to 10. FIG. 6 shows a starting material used in this method which consists, for example, of a flat smooth glass plate 60 and a thin metal layer 61 (200 to 300 Å) formed thereon by, for example, vacuum deposition. Then, as shown in FIG. 7, the thin metal layer 61 is selectively removed by irradiating Ar laser beams modulated by video signals. The reference numeral 70 represents portions where the metal layer 61 has been removed by the laser beams. The method of forming a pattern in this manner, unlike the method described hereinabove, can permit the confirmation (by monitoring) of recording at the time of irradiating the laser beams. Since, however, the metal layer is very thin (200 to 300 Å), videodisks made from this material as a disk-recording plate have pits of small depths. Consequently, the scattering or interference of light at the pits does not sufficiently occur, and the resulting products do not function as videodisks.

In order to overcome this difficulty, a negative photo-resist layer 80 is coated on the entire surface of the pattern so formed, as shown in FIG. 8. The back of the material is then exposed uniformly to the irradiation of of ultraviolet rays, and then the photoresist layer 80 is developed to produce raised portions 90, as shown in FIG. 9 (the difference in thickness between the raised portions 90 and the metal layer 61 is 1200 to 1600 Å). Thus, in the state shown in FIG. 9, a raised and depressed pattern sufficient to obtain the desired depth of pits can be made, and the products can be used as disk-recording plates, whereas in the state shown in FIG. 7, it is impossible to obtain a raised and depressed pattern which permits the formation of pits having sufficient depth for the scattering or interference of light in the resulting videodisks.

In the next step, as shown in FIG. 10, a thin metal layer 100 is formed on the entire surface of the assembly shown in FIG. 9, and another metal 101 is electroplated on it. Peeling of the metal layer gives a mother master. A metal is further plated on it and then peeled to form a press master. The press master so formed can be used for the production of videodisks in quite the same way as described hereinabove.

This method has the advantage of permitting monitoring of recording, but requires complicated process steps. It also presents difficulty in that the raised portions 90 of the pattern shown in FIG. 9 are formed only in an ideal case, and actually, the scattering of light occurs at the time of uniform exposure of the photoresist layer to ultraviolet rays, and makes the shape of the raised portions distorted at their edges (for example, even when it is desired to obtain raised portions having a rectangular cross-sectional shape, the resulting raised portions become chamfered). This leads to videodisks having a markedly reduced S/N ratio.

Still another method involves forming a metal layer having a thickness of 1200 to 1600 Å (which corresponds to one-fourth of the beam wavelength for reading) on a base plate, and selectively removing the metal layer by evaporation by direct application of laser beams to obtain a disk-recording plate. According to this method, monitoring can be done simultaneously with recording, and the accuracy of recording could be increased by feeding back the results of monitoring to a laser beam irradiating device. This method, however, has the defect that the metal layer having a thickness of 1200 to 1600 Å is difficult to remove by laser beams with a high degree of accuracy, and the method can only permit recording of extremely low resolution.

SUMMARY OF THE INVENTION

An object of this invention is to provide a method for producing information recording media which have pits of good shape and uniform depth and are suitable for use as disk-recording plates.

Another object of this invention is to provide a method for producing said information recording media in which the process steps are simple and monitoring can be performed at the time of recording.

The present invention provides a method for producing a disk-recording plate, which comprises successively forming an etching layer and a laser-sensitive layer on a substrate, exposing the assembly to the irradiation of laser beams to remove the laser-sensitive layer selectively, and then subjecting it to a sputter-etching treatment to remove the etching layer at portions corresponding to the removed portions of the laser-sensitive layer.

DETAILED DESCRIPTION OF THE INVENTION

Figure 12:
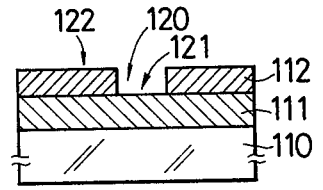
Figure 13:
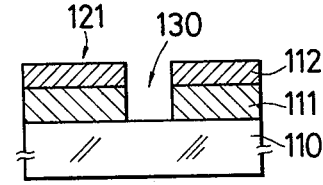

The invention is described in detail with reference to FIGS. 11 to 13.

Figure 1:
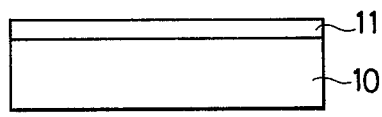
FIGS. 1 to 10 are sectional views showing the process for manufacturing conventional disk-recording plates and press masters.
Figure 2:
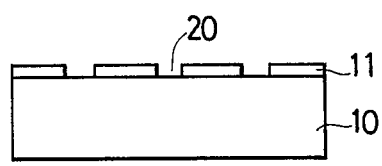
Figure 3:
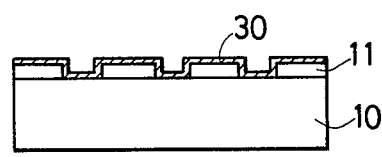
Figure 4:
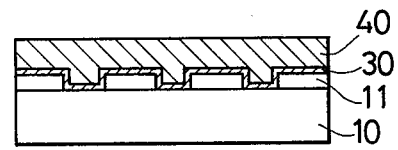
Figure 5:
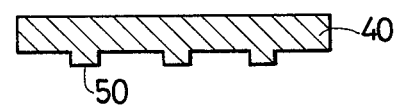
Figure 6:
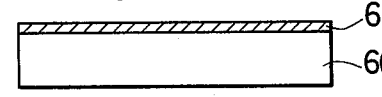
Figure 7:
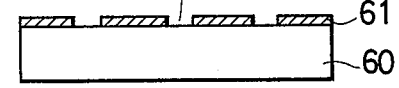
Figure 8:
Figure 9:
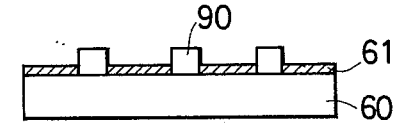
Figure 10:
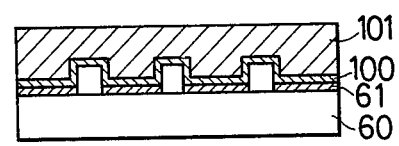
Figure 11:
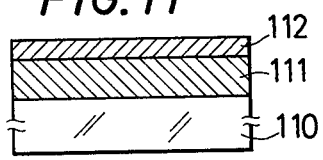
FIGS. 11 to 13 are sectional views showing the process for manufacturing disk-recording plates in accordance with this invention.

FIG. 11 shows a disk-recording plate in accordance with this invention, before recording, which consists of a substrate 110 and an etching layer 111 and a laser-sensitive layer 112 formed on the substrate.

The substrate 110 used in the method of this invention is selected from a wide range of materials, such as glass, metal or plastics, which have a smooth surface and good dimensional stability and preferably do not undergo corrosion or deformation during the manufacturing process. Optically polished glass is especially preferred. Glass of widely used materials such as borosilicate glass may be used, but glass not containing alkali elements and quartz glass are especially useful because they are resistant to damage by laser irradiation.

According to the present invention, an etching layer 111 is first formed on the substrate. The etching layer is made of a material which can be easily etched by sputter etching to be described hereinbelow. Typical examples of such materials are Si, $SiO_2$, $Si_3N_4$, Al, Mo and GaAs. These materials, either alone or as a mixture of two or more, in a single layer or in multiple layers, are caused to adhere to the substrate 110 by known techniques such as vacuum deposition or ion plating. The thickness of the etching layer is determined so as to meet the relation to be described with the thickness of laser-sensitive layer 112 (that is, the final thickness of the layers 111 and 112 becomes about 1200 to about 1600 Å). Usually, the thickness of the etching layer is preferably 1000 to 1500 Å.

Then, a laser-sensitive layer 112 is formed on the etching layer 111 by, for example, vacuum deposition or ion plating. The laser-sensitive layer 112 is made of a material which upon the application of laser beams, dissolves or sublimes and is removed at the exposed portions, and in which a portion 122 not exposed to laser beams acts as a mask for the etching layer beneath at the time of sputter etching to be described. In other words, it is a material which has high sensitivity to laser beams but has resistance to sputter etching or does not undergo sputter etching. Examples of such materials are elements such as Au, Cu, Cr, Ni, Co, Pt, Pd, Ir or Rh, and alloys such as stainless steel. Of these, Au, Cu and Cr are especially preferred. These elements or alloys may be used singly or as a mixture of two or more. The thickness of the laser-sensitive layer is one which is sufficient for the resulting layer 112 to act as a mask during sputter etching and meets the relation to be described with the thickness of the etching layer 111. Usually, the thickness of the laser-sensitive layer 111 is 200 to 500 Å.

Information such as sounds and/or images are converted by known means to strong and weak or on-off signals of an argon laser, helium-neon laser, helium-cadmium laser, etc., and the resulting laser beams are irradiated onto the material produced in the manner described hereinabove. Thus, as shown in FIG. 12, portions 120 of the laser-sensitive layer to which the laser beams have been applied are removed.

Then, using portions 122 not exposed to the laser beams as a mask, portions 121 of the etching layer 111 which correspond to the laser beam-exposed portions 120 are removed by sputter etching, thereby forming pits 130. Thus, a disk-recording plate shown in FIG. 13 is obtained.

In performing the sputter etching in this invention, a method sometimes called reactive sputter etching is used. This method comprises using a reactive gas, especially a halogenated hydrocarbon having the property of being easily gasified even at atmospheric pressure, as an introduction gas for sputter etching, and inducing sputtering involving a chemical reaction. Accordingly, the sputter etching in accordance with this invention can be achieved by performing a known sputtering treatment (for example, disclosed in Japanese Patent Publication No. 8328/69, and L. Maissel & R. Glang, Handbook of Thin Film Technology, pp. 7-49 to 7-53) in the presence of a halogenated hydrocarbon gas. High frequency sputtering treatment is preferred, and the suitable density of power applied is 0.1 to 3 $W/cm^2$.

Suitable examples of the halogenated hydrocarbon are those which are readily volatilizable under atmospheric pressure, such as fluorinated hydrocarbons, chlorinated hydrocarbons, and chlorofluorinated hydrocarbons which have 1 to 3 carbon atoms. Freon gases (e.g., $CF_4$, $CClF_3$, $CCl_2F_2$, $CCl_3F$, $CHClF_2$) and $CCl_4$ are especially preferred. These halogenated hydrocarbon gases may contain up to certain amounts of oxygen or air. For example, Freon-12 ($CCl_2F_2$) may contain up to 30% by volume of oxygen, and $CCl_4$ may contain up to 30% by volume of oxygen or air.

The pressure of the gas at the time of sputtering is set at $10^{-3}$ to $10^{-1}$ Torr, especially $5\times10^{-3}$ to $5\times10^{-2}$ Torr. The gas is partly or wholly converted to a plasma by glow discharge generated within the sputtering device. The plasma performs a chemical reaction with the material which constitutes the etching layer, and at the same time, ordinary sputtering (the action of accelerated ions or neutral atoms to throw out the material which constitutes the etching layer) takes place to cause etching.

The etching layer 111 and the laser-sensitive layer 112 are formed on the substrate so that after the sputter etching treatment, the total thickness of these layers becomes 1200 to 1600 Å. It is possible also to adjust the total thickness of these layers to the above range by chemically or physically etching the laser-sensitive layer 122 shown in FIG. 13 after the sputter etching treatment. When the adjustment of the thickness is performed by chemical etching, an etchant can be selected according to the material of the laser-sensitive layer 112. For example, when Cu is used in the laser-sensitive layer 112, a 20–60% solution of ferric chloride or a mixed solution of ammonium persulfate and mercuric chloride, such as those described in Japanese Patent Publication No. 27517/64, is a suitable etchant.

The physical etching is, for example, sputtering in an atmosphere of Ar or $N_2$ to etch off the laser-sensitive layer 112. This sputtering should be clearly distinguished from the sputtering in a reactive gas atmosphere described hereinabove. The Al or Si, etc. of the etching layer 111 at the side surface of the inside of the pits has a very high rate of etching in a reactive sputter etching atmosphere such as Freon gases. But since in an atmosphere of $Ar_2$ or $N_2$, the etching rate is extremely small, only the laser-sensitive layer can be etched.

The disk-recording plate produced in the manner mentioned above can be directly used as reproducing media. Alternatively, a press master having a reverse pattern may be obtained from the disk-recording plate by known methods such as plating, and a large number of videodisks may be produced at low cost by successively transferring the pattern of the press master.

Since according to the present invention, the laser-sensitive layer 111 is removed by direct irradiation of laser beams, monitoring can be performed at this time by using another laser beam, setting its point of irradiation at the rear of the point of irradiation of the preceding laser beam for recording (by removing portions of the laser sensitive layer), and detecting the reflected light from the etching layer by, for example, photodiode.

Furthermore, since the sputter etching described hereinabove is used in this invention, no side etch occurs, and the shape of the unexposed portion 121 of the laser-sensitive layer is reproduced faithfully. The angle between the substrate and the side surface of the pit can be made substantially perpendicular. Hence, recording with very good resolution can be performed.

The method of this invention consists of two simple treating steps both of which can be performed in the dry state, and it is not likely to cause pollution. Hence, the present invention has great utility.

The following Examples illustrate the present invention in more detail.

EXAMPLE 1

An optically polished borosilicate glass plate (10 mm thick) was set in a vacuum deposition device, and under a vacuum of $3 \times 10^{-5}$ Torr, Al was vacuum-deposited on the glass plate to a thickness of 1500 Å. Two minutes after the deposition of Al, Cu was vacuum-deposited to a thickness of 350 Å under the same degree of vacuum.

Using the resulting sample, information was recorded by laser. Specifically, the surface of the sample was exposed to the irradiation of laser beams modulated by signals of the information. The Cu layer alone on the surface could be etched by irradiation of 1170 mW when the laser beam diameter was 3μ, and the laser irradiating time was $1 \times 10^{-6}$ sec. This could be confirmed by using a scanning X-ray micro-analyzer.

Then, the sample was placed in a sputter etching device (UDS-65, a product of Nippon Electric Varian Co., Ltd.), and sputter etching was performed for 1 minute at an applied power density of 1.0 W/cm² in the presence of a Freon gas ($CCl_2F_2$) under a pressure of $1.0 \times 10^{-2}$ Torr. By this procedure, Al in the laser-irradiated portion was completely etched off. At this time, substantially all of the Cu layer in the laser-unexposed area was etched, and a disk-recording master was obtained.

EXAMPLE 2

An optically polished borosilicate glass plate (10 mm thick) was set in a vacuum deposition device, and Al was vacuum-deposited on the glass sheet to a thickness of 1500 Å under a vacuum of $5 \times 10^{-5}$ Torr. Then, Au was vacuum-deposited to a thickness of 270 Å.

In the same way as in Example 1, the surface was irradiated with an Ar laser, and then in the presence of a Freon gas under a pressure of $1.2 \times 10^{-2}$ Torr, a high frequency plasma was generated and a power of 1.2 W/cm² was applied. Thus, sputter etching was performed for 1.5 minutes to etch off Al completely at portions corresponding to the removed Au layer. At this time, Au in the laser-unexposed portion was also etched off almost completely. Thus, a disk-recording plate having an Al layer of 1500 Å in thickness at the laser-unexposed portion and no Al at the laser-exposed portion was obtained.

EXAMPLE 3

An optically polished Vycor glass plate (10 mm thick) was set in a vacuum chamber, and under a vacuum of $5 \times 10^{-6}$ Torr, Si was vacuum-deposited to a thickness of 1450 Å by an electron beam depositing method. Then, Au was vacuum-deposited to a thickness of 300 Å by the same electron beam depositing method.

In the same way as in Example 1, the Au layer was partially removed at 780 mW power. Then, sputter etching was performed for 3 minutes by applying a power of 0.8 W/cm² in the presence of a mixed gas of Freon gas and oxygen in a ratio of 8:2 under a pressure of $1.2 \times 10^{-2}$ Torr. As a result, Si in the laser-exposed portion was removed. A part of the Au in the laser-unexposed portion remained, and the total thickness could be adjusted to 1500 Å. Thus, a disk recording master could be obtained.

What is claimed is:

1. A method for producing a disc-recording plate from a composite layer consisting of a substrate, an etching layer having a thickness of 1000 to 1500 Å overlying said substrate and a laser-sensitive layer having a thickness of 200 to 500 Å overlying said etching layer, wherein the said laser-sensitive layer is composed of a material selected from the group consisting of Au, Cu, Cr, Ni, Co, Pt, Pd, Ir, Rh and stainless steel, and wherein the etching layer is easily etched by a reactive sputter-etching treatment in an inert atmosphere of a halogenated hydrocarbon and the laser-sensitive layer has a resistance to the reactive sputter etching in said atmosphere of halogenated hydrocarbon, said method comprising: exposing the assembly to the irradiation of laser beams to selectively remove the laser-sensitive layer, and then subjecting the assembly to the reactive sputter-etching treatment in the atmosphere of the halogenated hydrocarbon under a pressure of $10^{-3}$ to $10^{-1}$ Torr to remove the etching layer at portions corresponding to the removed portions of the laser-sensitive layer.

2. The method of claim 1 wherein the halogenated hydrocarbon is a Freon gas or carbon tetrachloride.

3. The method of claim 1 wherein the pressure of the gaseous atmosphere is $5 \times 10^{-3}$ to $5 \times 10^{-2}$ Torr.

4. The method of claim 1 wherein the step of forming the etching layer and the laser-sensitive layer is performed by vacuum-deposition.

5. The method of claim 1 wherein the step of forming the etching layer and the laser-sensitive layer is performed by electron beam deposition.

6. The method of claim 1 wherein the substrate is selected from the group consisting of glass, metal and plastics.

7. The method of claim 1 wherein the substrate is optically polished glass.

8. The method of claim 1 wherein the etching layer is composed of a material selected from the group consisting of Si, $SiO_2$, $Si_3N_4$, Al, Mo and GaAs.

9. The method of claim 1 wherein the laser-sensitive layer is composed of an element selected from the group consisting of Au, Cu and Cr.

10. The method of claim 1 wherein the total thickness of the etching layer and the laser-sensitive layer after the sputter-etching treatment is 1200 to 1600 Å.

11. The method of claim 10 wherein the total thickness is attained by physically etching the laser-sensitive layer after the sputter-etching treatment.

12. The method of claim 11 wherein the physical etching is performed by sputtering in an atmosphere of $Ar_2$ or $N_2$.

13. The method of claim 10 wherein the total thickness is attained by chemically etching the laser sensitive layer after the sputter-etching treatment.

14. The method of claim 13 wherein the chemical etching is performed by using a 20-60% solution of ferric chloride, or a mixed solution of ammonium persulfate and mercuric chloride as an etchant.

* * * * *